(12) United States Patent
Handshaw et al.

(10) Patent No.: US 12,159,188 B1
(45) Date of Patent: Dec. 3, 2024

(54) IMAGING DEVICES WITH USER-INTERFACE CONTROLS

(71) Applicant: ZEBRA TECHNOLOGIES CORPORATION, Lincolnshire, IL (US)

(72) Inventors: Darran Michael Handshaw, Sound Beach, NY (US); Yuly Mitelman, Stony Brook, NY (US); Mark Drzymala, Saint James, NY (US); Edward Barkan, Miller Place, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 0 days.

(21) Appl. No.: 18/375,369

(22) Filed: Sep. 29, 2023

(51) Int. Cl.
  *G06K 7/14* (2006.01)
  *G06K 7/10* (2006.01)
  *H05K 1/18* (2006.01)

(52) U.S. Cl.
  CPC ....... *G06K 7/1408* (2013.01); *G06K 7/10831* (2013.01); *G06K 7/1447* (2013.01); *H05K 1/181* (2013.01); *H05K 2201/10151* (2013.01); *H05K 2201/10265* (2013.01)

(58) Field of Classification Search
  CPC .. G06K 7/10831; G06K 7/1447; H05K 1/181; H05K 2201/10151; H05K 2201/10265
  See application file for complete search history.

(56) References Cited

U.S. PATENT DOCUMENTS 6,144,552 A * 11/2000 Whitcher .......... G02F 1/133308
  345/905
2002/0040934 A1* 4/2002 Itou ...................... G06K 7/1098
  235/462.43

* cited by examiner

Primary Examiner — Jamara A Franklin
(74) Attorney, Agent, or Firm — Yuri Astvatsaturov (57) ABSTRACT

Devices for improving user-interface (UI) controls in an imaging device are disclosed herein. In some embodiments, such imaging devices include a housing having an internal cavity and a window where a flange portion extending around some portion of the window includes touch-enabled UI controls positioned on an exterior surface. On a correspondingly opposite (interior) surface of the flange portion there exists a printed circuit board (PCB) with touch-sensors that correspond to the UI controls. To increase the efficacy of the touch-controls, a spring element is positioned behind the PCB to bias the PCB towards the rear surface of the interior surface of the flange portion and reduce and/or eliminate an air gap between said surface and the sensor(s) and/or the PCB.

20 Claims, 6 Drawing Sheets

IMAGING DEVICES WITH USER-INTERFACE CONTROLS

BACKGROUND

Imaging devices like, for example, indicia readers commonly have user-interface (UI) controls positioned thereon which enable operators to change certain parameters on said devices. Although conventional mechanical buttons have been used in the past, solutions employing these means can be susceptible to mechanical failure and may be less successful in providing environmental sealing of internal components. Thus, there is a continued need for improved approaches to providing UI controls on imaging devices that provide advantages over the aforementioned mechanical systems.

SUMMARY

Accordingly, at least some embodiments of the present disclosure are directed to devices with improved UI controls.

In an embodiment, the present invention is an imaging device comprising: a housing having an internal cavity and a window; an imaging assembly disposed at least partially within the housing, the imaging assembly having a field of view, wherein at least a portion of the field of view passes through the window; a flange portion extending at least partially around the window, the flange portion having a first surface facing the internal cavity and a second surface facing exteriorly, the second surface being diametrically opposed to the first surface, the second surface having a UI control region; a printed circuit board (PCB) having at least one capacitive touch sensor positioned thereon, the PCB being positioned adjacent the first surface of the flange portion; a springingly biasing tension element positioned within the cavity, the springingly biasing tension element exerting a biasing force against the PCB to bias the PCB against the first surface of the flange portion such that the at least one capacitive touch sensor is aligned with the UI control region.

In another embodiment, the present invention is an indicia reader comprising: a housing having a lower portion and an upper portion extending to a height greater than the lower portion, the lower portion having a generally horizontal window extending in a generally horizontal plane, the upper portion having an upright window extending in a generally upright direction relative to the generally horizontal plane; an imaging assembly positioned at least partially inside the housing, the imaging assembly having associated therewith at least one FOV that extends through the generally horizontal window and at least one other FOV that extends through the upright window; a flange portion extending at least partially around the upright window, the flange portion having a first surface facing an internal cavity of the upper portion of the housing and a second surface facing a product scanning region of the indicia reader, the second surface being diametrically opposed to the first surface, the second surface having a UI control region; a PCB having at least one capacitive touch sensor positioned thereon, the PCB being positioned adjacent the first surface of the flange portion; a springingly biasing tension element positioned within the cavity, the springingly biasing tension element exerting a biasing force against the PCB to bias the PCB against the first surface of the flange portion such that the at least one capacitive touch sensor is aligned with the UI control region.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

As used herein, the term "indicia" or "indicium" should be understood to refer to any kind of visual marker that can be associated with an item or a transaction. For example, indicia can be a 1D, 2D, or 3D barcode, a graphic, a logo, etc. Additionally, indicia may comprise encoded payload data as, for example, is the case with a 1D or 2D barcode where the barcode encodes a payload comprised of, for example, alphanumeric or special characters that may be formed into a string.

It has been recognized that in the manufacture and/or assembly or conventional imaging devices, like for example indicia readers, that employ capacitive-touch (CT) UI controls, difficulties may arise in ensuring proper positioning of CT sensors relative to the UI control surface. As such, the present disclosure provides innovative approaches to solving this problem.

Figure 1:
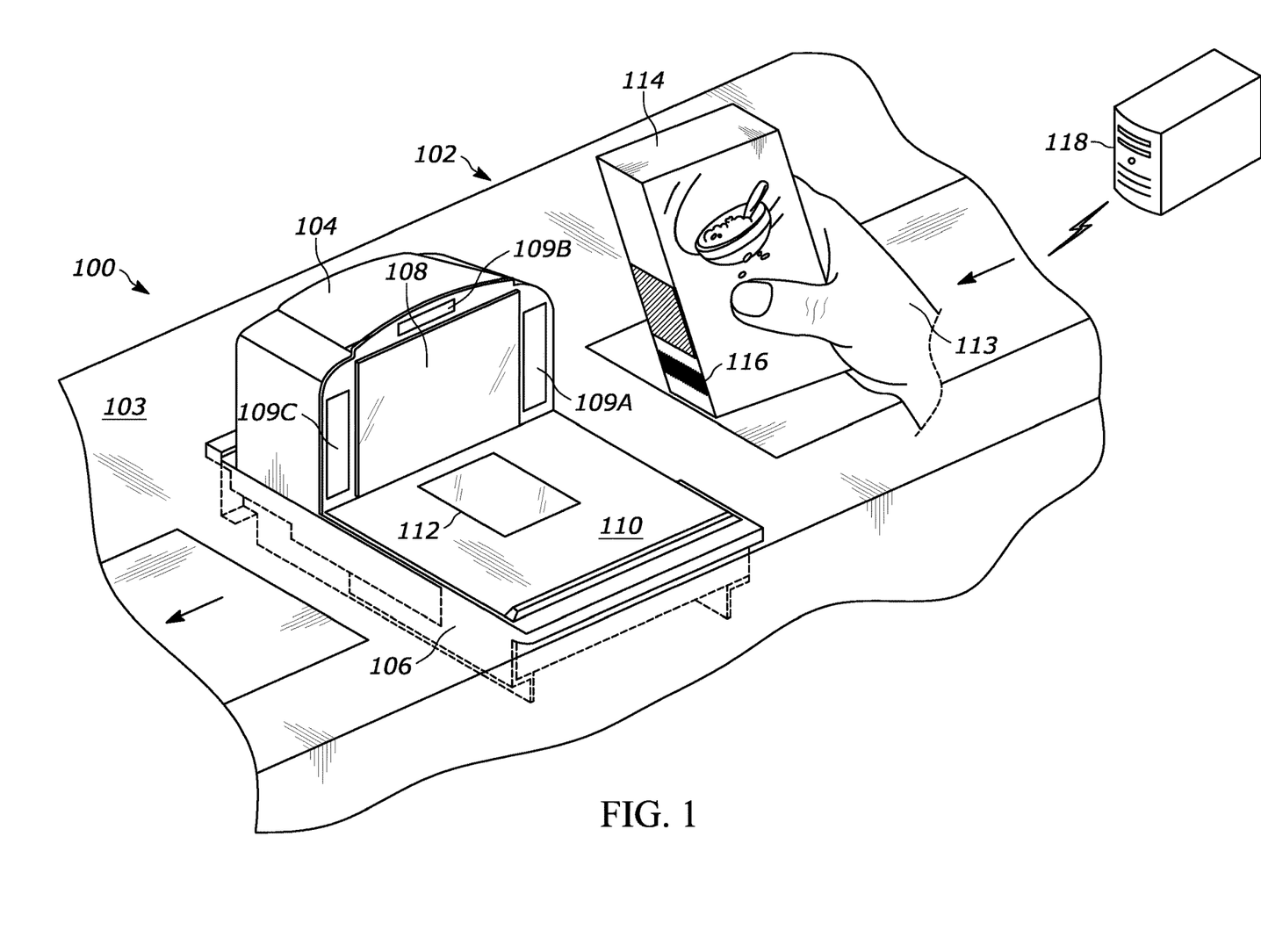
FIG. 1 is a perspective view of an example indicia reader that may be used to implement inventive concepts described here.

Referring to FIG. 1, shown therein is an example imaging device embodied in a bi-optic indicia reader 100. In the illustrated example, the bioptic indicia reader 100 is shown as part of a point-of-sale (POS) system arrangement 102 having the bioptic indicia reader 100 positioned within a workstation counter 103. Generally, the indicia reader 100 includes an upper housing 104 (also referred to as an upper portion, upper housing portion, or tower portion) and a lower housing 106 (also referred to as a lower portion, lower housing portion, or platter portion). The upper housing 104 can be characterized by an optically transmissive window 108 positioned therein along a generally vertical (or upright) plane and one or more field of view (FOV) which passes through the window 108 and extends in a generally lateral direction. In some examples, a reference to a generally upright window shall be understood to mean a window inclined at an angle of up to 35 degrees relative to a vertical plane. The window 108 may be surrounded, at least partially, by a flange that includes UI controls positioned in, for example, regions 109A, 109B, and/or 109C. The lower housing 106 can be characterized by a weigh platter 110 or a cover that includes an optically transmissive window 112 positioned therein along a generally horizontal (also referred to as a transverse) plane and one or more FOV which passes through the window 112 and extends in a generally upward direction. In some examples, a reference to a generally horizontal window shall be understood to mean a window inclined at an angle of up to 25 degrees relative to a horizontal plane. The weigh platter 110 is a part of a weigh platter assembly that generally includes the weigh platter 110 and a scale (or load cell) configured to measure the weight of an object placed the top surface of the weight platter 110. By that virtue, the top surface of the weight platter 110 may be considered to be the top surface of the lower housing 106 that faces a product scanning region there above.

In operation, a user 113 generally passes an item 114 across a product scanning region of the indicia reader 100 in a swiping motion in some general direction, which in the illustrated example is right-to-left. A product scanning region can be generally viewed as a region that extends above the platter 110 and/or in front of the window 108 where barcode reader 100 is operable to capture image data of sufficient quality to perform imaging-based operations like decoding a barcode that appears in the obtained image data. It should be appreciated that while items may be swiped past the indicia reader 100 in either direction, items may also be presented into the product scanning region by means other than swiping past the window(s). When the item 114 comes into the any of the fields of view of the reader, the indicia 116 on the item 114 is captured and decoded by the indicia reader 100 (and its respective modules and/or assemblies), and corresponding data (e.g., the payload of the indicia) is transmitted to a communicatively coupled host 118 (commonly comprised of a point of sale (POS) terminal).

Figure 2:
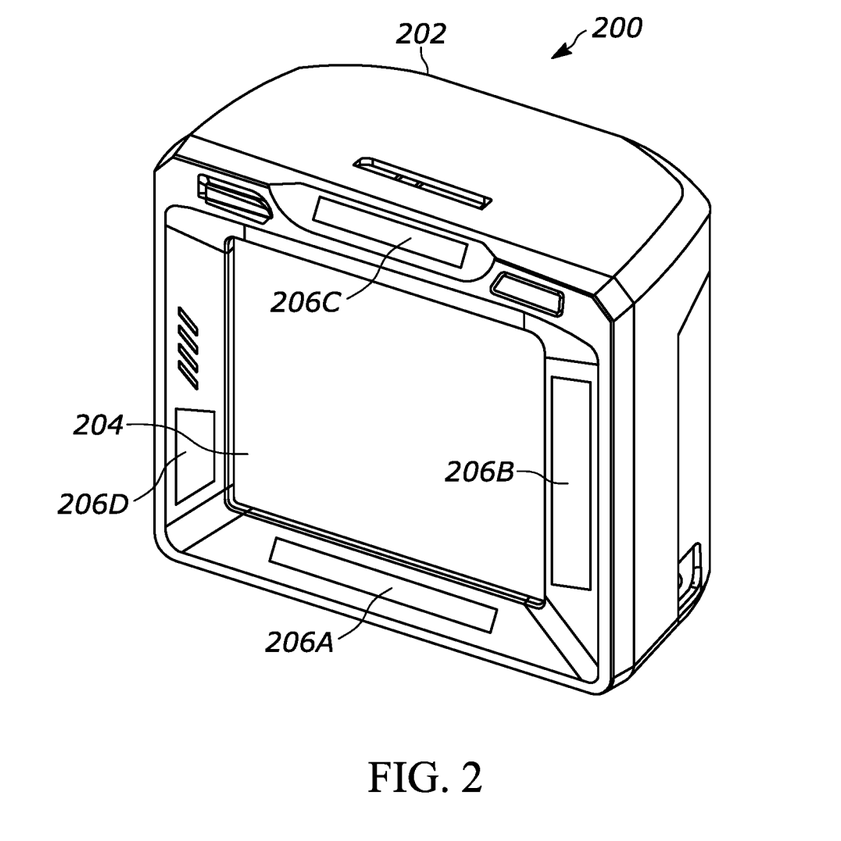
FIG. 2 is a perspective view of another example barcode reader that may be used to implement inventive concepts described here.

FIG. 2 illustrates another example of an indicia reader, sometimes referred to as a slot scanner. In the example shown, indicia reader 200 has a housing 202 and a window 204, which faces a product scanning region, to allow a set of optical components positioned within housing 202 to direct at least one field-of-view through window 204. Indicia reader 200 operates on a similar principle as the reader 100 of FIG. 1. However, it is generally smaller (typically having a window that is smaller than 5 inches across), includes a single window, and, while it could be installed in a slot of a counter (functioning like the bottom portion of the reader 100), it can also be used as a stationary scanner positioned on a working surface (functioning like the upper portion of the reader 100). In this example, the reader 200 includes a flange region around the window 204 that includes UI controls positioned in, for example, regions 206A, 206B, 206C, and/or 206D.

In the above-noted examples, and other various embodiments, the imaging device may include a 2D imaging assembly that may include an image sensor (also referred to as an imager or imaging sensor) that can be, for example, a two-dimensional CCD or a CMOS sensor that can be either a monochrome sensor or a color sensor having, for instance 1.2 megapixels arranged in a 1200×960 pixel configuration. It should be appreciated that sensors having other pixel-counts (both below and above) may also be used. These two-dimensional sensors generally include mutually orthogonal rows and columns of photosensitive pixel elements arranged to form a substantially flat square or rectangular surface. Such imagers are operative to detect light captured by an imaging lens assembly along a respective optical path or axis that normally traverses through either of the generally horizontal or generally upright window(s) with the assistance of one or more splitter and/or fold mirrors (also referred to as a mirror arrangement).

Figure 3:
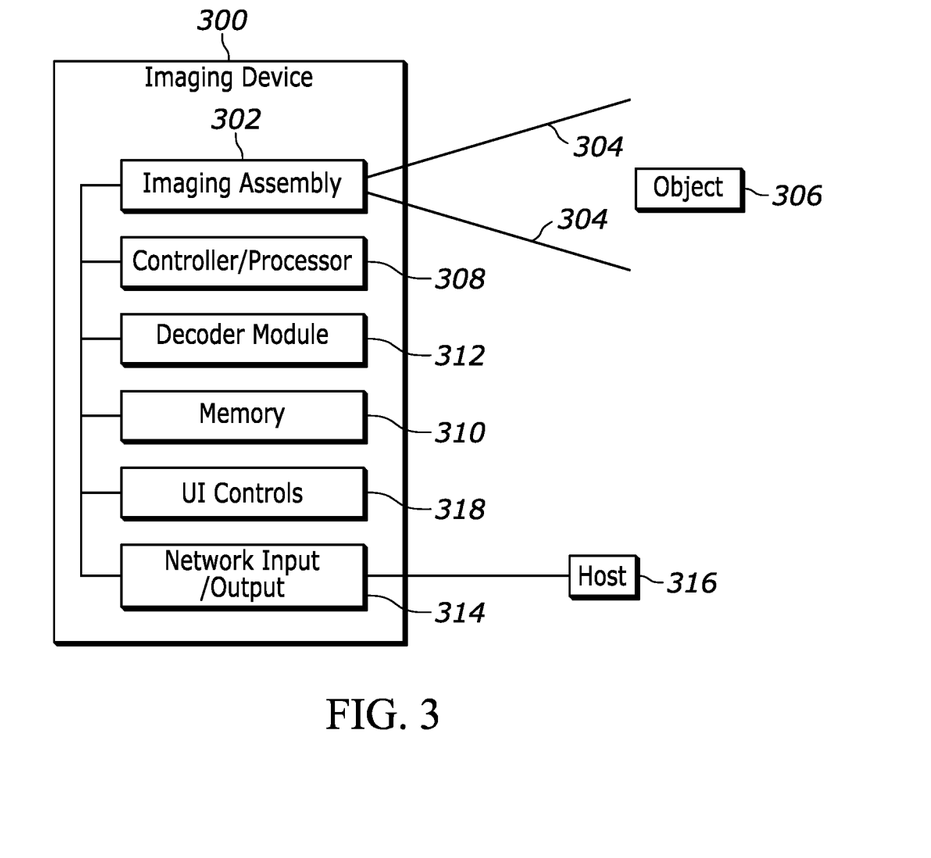
FIG. 3 is a schematic block diagram of an example imaging device implemented in accordance with some examples of the present disclosure.

These and other components of an example reader can be seen in a schematic block diagram 300 of FIG. 3. As represented therein, an example imaging device 300, regardless or form factor, includes an imaging assembly 302 that is operable to capture image data over a field of view (FOV) 304 of an object 306 appearing within said FOV. Operation of this imaging assembly, and other modules of the imaging device 300, can be controlled via a controller (may also be referred to as a processor) 308 by way of executing various instructions stored in the memory 310. In instances of the imaging device 300 being an indicia reader, it can further include a decoder module 312 that can analyze image data captured by the imaging assembly 302 and decode various indicia that may be present therein. Once decoded, the controller 308 can cause the reader to transmit the decoded payload data, via a network 1/O module 314, to a host 316 that is communicatively (wired or wirelessly) coupled with the imaging device. In some cases, image data itself of information related thereto may be transmitted to the host 316. To allow an operator to control certain aspects of the imaging device, the device also includes various UI control 318. These controls may allow the operator to, for example, power the device on and off, change a volume of an alert, cause it to capture one or more images pursuant to certain parameters and/or process an image pursuant to certain parameters, enable/disable wireless communications, initiate wireless pairing procedures, alter illumination parameters, etc.

Figure 4:
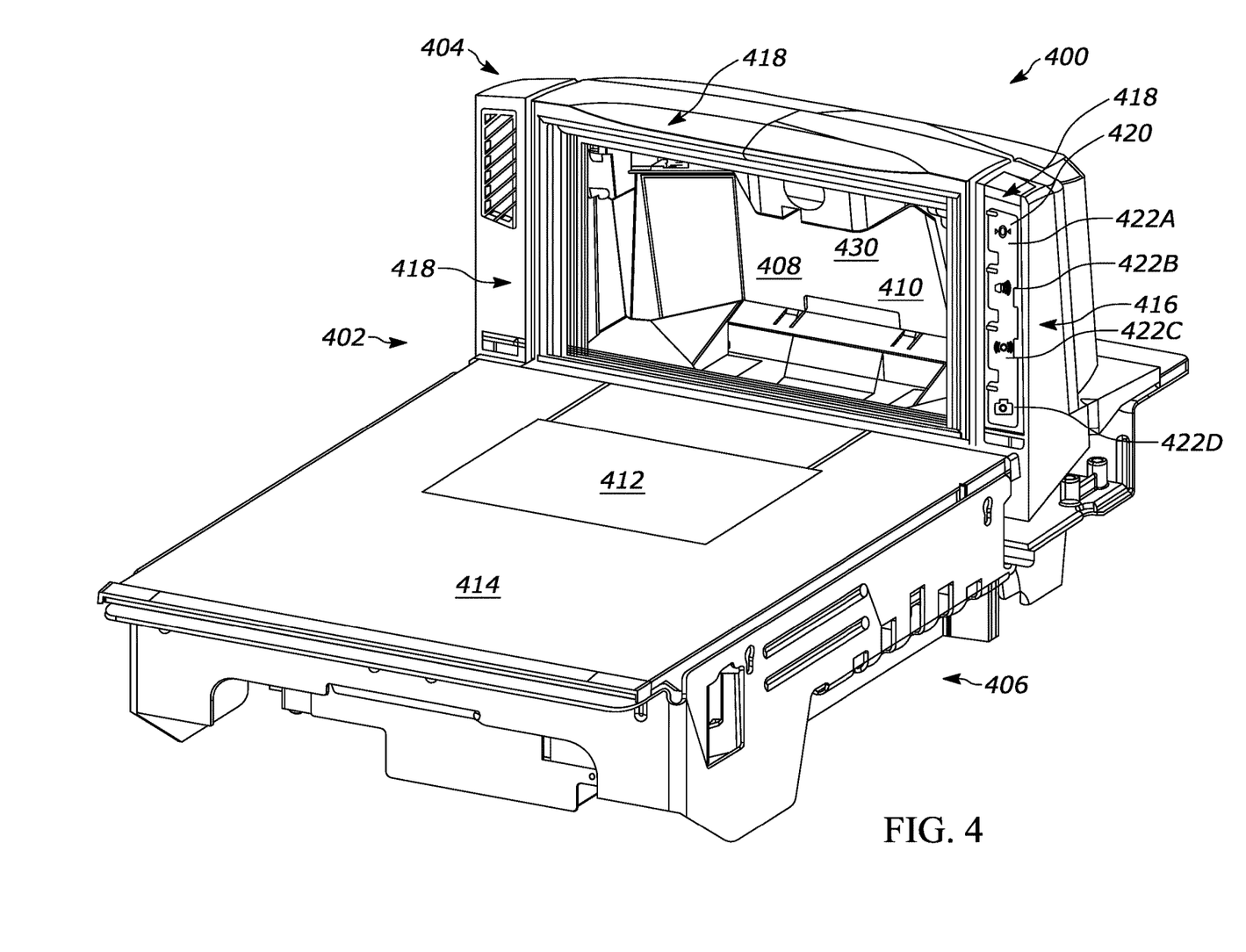
FIG. 4 is a perspective view of an example imaging device implemented as an example bi-optic indicia reader in accordance with an embodiment of the present disclosure.

FIG. 4 illustrates an example implementation of an imaging device 400 embodied in a bi-optic indicia reader similar to that of FIG. 1. As with the reader 100, indicia reader 400 includes a housing 402 having an upper portion 404 and a lower portion 406. On or both of these components can be seen as defining an internal cavity 408 where various elements of the imaging device 400 are installed. These can include, but are not limited to, imaging components like one or more imaging assemblies (which may include one or more mirrors to help direct any FOV in a preferred direction, like having it extend into the product scanning region), electronic components like circuitry, and one or more chassis for supporting these and/or other components. Preferably, the internal cavity is environmentally sealed to prevent egress of dust, dirt, and/or humidity to ensure proper operation of internal components. The upper portion 404 extends some distance above the lower housing 406 and includes an upright window 410 through which one or more FOVs can be directed towards the product scanning region in a generally horizontal direction. The lower portion 406 is positioned below the upper portion 404 and includes its own respective window 412 through which another one or more FOVs may be directed towards the product scanning region in a generally upward direction. The lower portion 406 may further include a weigh platter 414 (which may include its own window over the window 412) which can be used to weigh items placed thereon.

In this embodiment, the reader 400 includes a series of user-interface controls 416 positioned within the upper portion 404. More specifically, the upper portion 404 includes a flange region 418 that, in the current embodiment, extends partially around the window 410. It should be appreciated that references to a flange positioned at least partially around an element shall be understood to include any physical structure that appears next to any portion of the referenced element. As such, in the current embodiment a flange positioned at least partially around a window shall be understood to include any portion of the upper portion that appears near or adjacent to the window 410. The right-side flange region 418 includes a plate 420 having four UI areas 422A, 422B, 422C, and 422D (collectively 422). The plate 420 may be recessed within a housing of the upper portion 404 or attached thereto via, for example, adhesive. In other examples, the UI area may be labeled by way of individual plates or may be engraved on the housing. In still other examples, the UI areas may be identified in any manner so long as they are visually and/or tactilely discernable by an operator. Each of the areas 422 is associated with some UI control that itself is associated with some aspect of the reader's operation.

To increase robustness of the imaging device, the UI controls are implemented by way of capacitive touch controls, allowing the region occupied by the controls to remain environmentally sealed and/or allowing the imaging reader to reduce the implementation of mechanical switching components.

Figure 5:
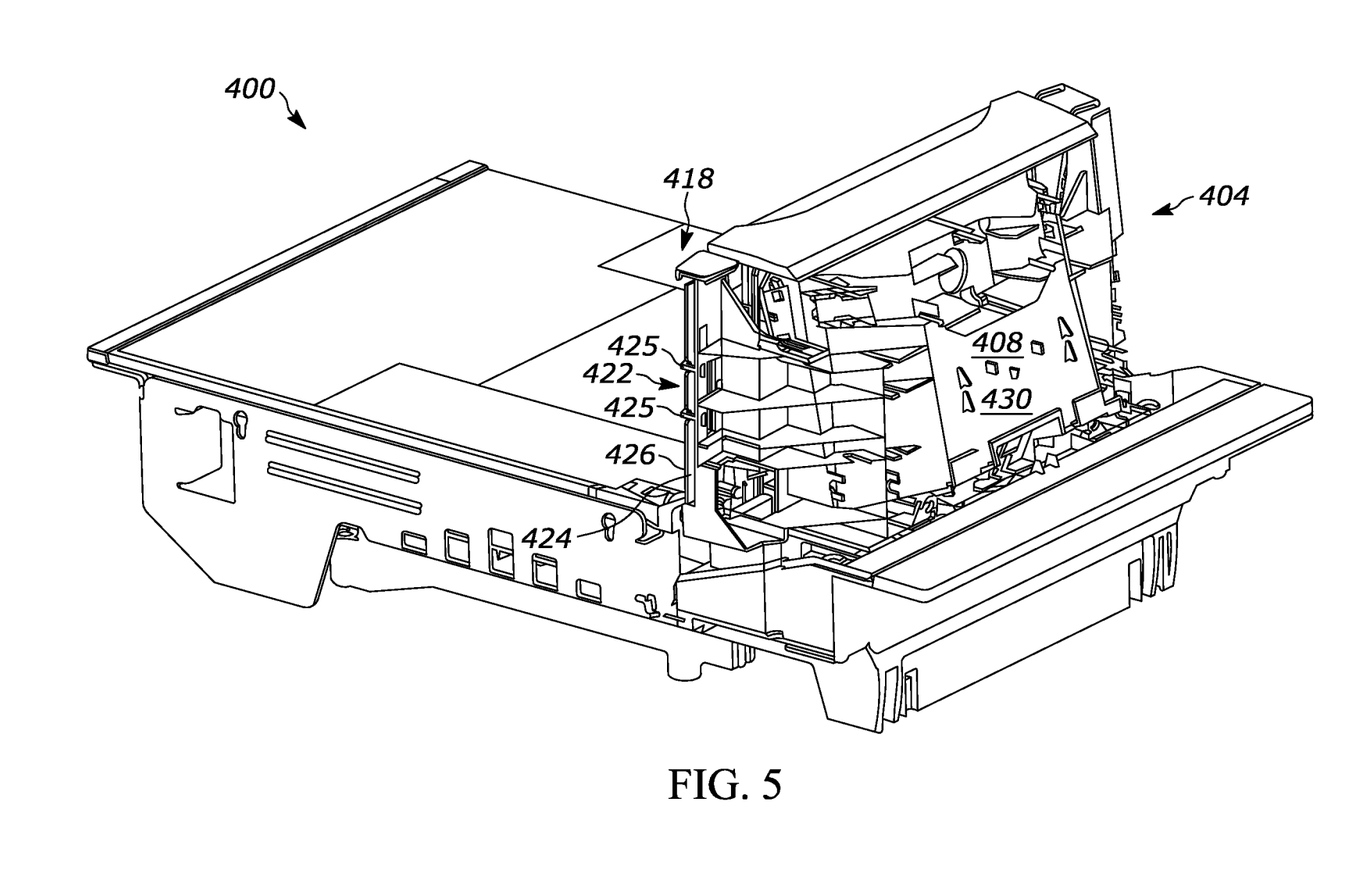
FIG. 5 is a rear perspective view of the reader of FIG. 4 with a rear cover removed.

Referring to FIG. 5, which illustrates a rear perspective view of the reader 400 with the cover of the upper portion 404 removed and at least some portion of the internal cavity exposed, to enable the touch-control functionality of the UI controls, a printed circuit board (PCB) 424 is positioned behind the wall 426 of the flange portion 418. In this way, it may be said that the flange portion includes one surface that faces the internal cavity and that abuts the PCB 424, and another, diametrically opposed surface that faces the exterior of the imaging device 400 and includes the UI controls thereon. In order to sense the touch of an operator, the PCB 424 includes one or more touch sensors (e.g., capacitive touch sensors that may be implemented as isolated copper regions on the PCB that are in electrical contact with a capacitive touch sensing microchip) that correspond to the UI control area(s) (which in the present embodiment include 422A-D).

Figure 6:
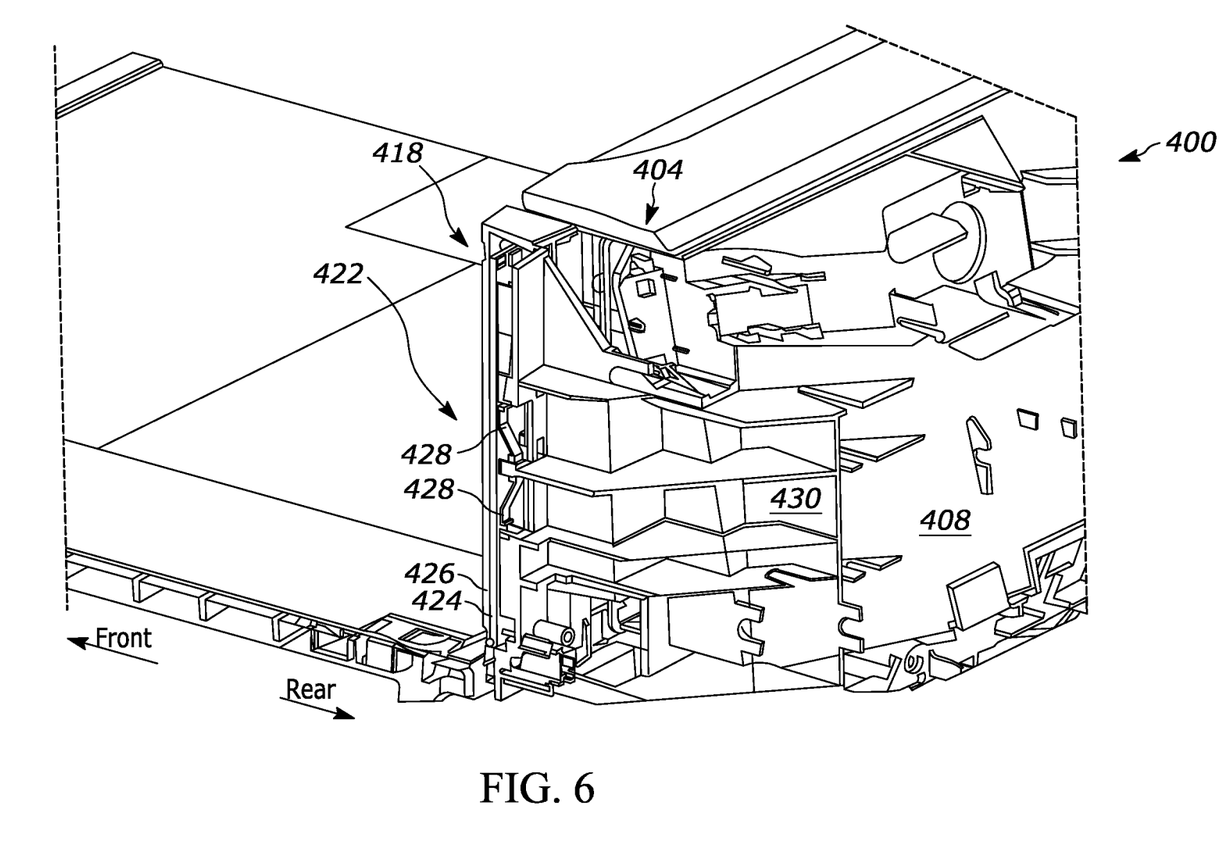
FIG. 6 is a zoomed in and sectioned view of the reader as shown in FIG. 5.

To help ensure effective sensing of an operator's touch input, the air gap between the PCB (and specifically the touch sensors) and the inwardly facing surface of the wall 426 should be reduced or effectively eliminated. To assist with this, various embodiments of the imaging devices disclosed herein employ a springingly biasing tension element to exert a biasing force against the PCB to bias the PCB against the interior surface of the flange portion. An example of such springingly biasing tension element is illustrated in FIG. 6 which shows a partially sectioned view of the device 400 of FIG. 5. As shown therein, the PCB 424 abuts the rear surface of the wall (flange portion) 426 with a springingly biasing tension element 428 pressing up against the rear surface of the PCB 424 and biasing it in the frontward direction helping it maintain a reduced and/or eliminated airgap between the PCB 424 and the wall 426. It should be appreciated that while the wall 426 and the PCB 424 are illustrated and referenced as the components for which an air gap is being reduced, it is within the scope of the subject disclosure that any of the touch sensors positioned on the PCB 424 may extend above the surface of the PCB 424 itself. As such, the biasing force of the element 428 should still provide the desired result of biasing the touch sensor(s) (albeit indirectly) against the interior surface of the wall 426 to effectively maintain a reduced or eliminated airgap between the wall surface and the sensor(s).

In the illustrated embodiment the, the springingly biasing tension element 428 is implemented as a spring-leaf element providing pressure against the PCB 424 at two distinct points. This, however, should not be viewed as a limiting design and other types of springs may be implemented so long as they are operative to provide the necessary biasing force on the PCB 424. For example, element 428 may be implemented as a coil spring in combination with a planar element that can help translate and distribute the force of the coil spring on the PCB. In other cases, the springingly biasing tension element 428 may be a solid, but elastomeric element like, for example, a rubber spacer or a foam pad, that can exert some force against PCB 424 when positioned against its rearward surface.

Additionally, it should be appreciated that the springingly biasing tension element 428 may be constructed of a variety of materials that exhibit some level of non-plastic deformation at a given level of force. For example, the leaf-spring example of element 428 may be constructed from the plastic material of the chassis 430 that is used to support various elements inside the reader 400 like parts of the imaging assembly. In this way, the wings of the leaf-spring 428 press against the PCB 424 and deflect under a force that, preferably, does not cause plastic deformation thereof. Thus, the PCB 424 can remain in the biased position when the reader 400 is assembled. In other examples, the element 428 may be fully or partially metallic, and or it may be constructed of a composite material that exhibits springing characteristics.

Additionally, other anchor points (besides the chassis 430) may be relied upon. For example, a springingly biasing tension element 428 may be provided on the rear cover of the upper portion 404, one or more or springingly biasing tension elements 428 may be provided on the rear surface of the flange portion 418 which could help press the PCB against said surface.

In some cases, the PCB 424 and at least one of the chassis 430 or the rear surface of the wall 426 may include corresponding location features, like snaps 425, that help guide and position the PCB 424 in place. These features can help align the touch sensors with the designated touch regions. Additionally, advantages of this design are that the chassis can be loaded into an upper housing pocket from below. The PCB is attached to the chassis and the spring features then push the PCB forward so that it is seated correctly upon assembly.

While the example shown in FIGS. 4-6 illustrates the UI controls and the accompanying electrical and mechanical structures being implemented on the right lateral side of the reader, it is within the scope of the invention that such construction can be equally applied in other regions of the reader, like, for example, regions 109B and 109C of FIG. 1 and regions 206A-D of FIG. 2. Additionally, the same designs may be applied to other portions of the imaging design that do not necessarily abut the window and may instead be positioned on any portion of the device's housing.

The above description refers to a block diagram of the accompanying drawings. Alternative implementations of the example represented by the block diagram includes one or more additional or alternative elements, processes and/or devices. Additionally or alternatively, one or more of the example blocks of the diagram may be combined, divided, re-arranged or omitted. Components represented by the blocks of the diagram are implemented by hardware, software, firmware, and/or any combination of hardware, software and/or firmware. In some examples, at least one of the components represented by the blocks is implemented by a logic circuit. As used herein, the term "logic circuit" is expressly defined as a physical device including at least one hardware component configured (e.g., via operation in accordance with a predetermined configuration and/or via execution of stored machine-readable instructions) to control one or more machines and/or perform operations of one or more machines. Examples of a logic circuit include one or more processors, one or more coprocessors, one or more microprocessors, one or more controllers, one or more digital signal processors (DSPs), one or more application specific integrated circuits (ASICs), one or more field programmable gate arrays (FPGAs), one or more microcontroller units (MCUs), one or more hardware accelerators, one or more special-purpose computer chips, and one or more system-on-a-chip (SoC) devices. Some example logic circuits, such as ASICs or FPGAs, are specifically configured hardware for performing operations (e.g., one or more of the operations described herein and represented by the flowcharts of this disclosure, if such are present). Some example logic circuits are hardware that executes machine-readable instructions to perform operations (e.g., one or more of the operations described herein and represented by the flowcharts of this disclosure, if such are present). Some example logic circuits include a combination of specifically configured hardware and hardware that executes machine-readable instructions. The above description refers to various operations described herein and flowcharts that may be appended hereto to illustrate the flow of those operations. Any such flowcharts are representative of example methods disclosed herein. In some examples, the methods represented by the flowcharts implement the apparatus represented by the block diagrams. Alternative implementations of example methods disclosed herein may include additional or alternative operations. Further, operations of alternative implementations of the methods disclosed herein may combined, divided, re-arranged or omitted. In some examples, the operations described herein are implemented by machine-readable instructions (e.g., software and/or firmware) stored on a medium (e.g., a tangible machine-readable medium) for execution by one or more logic circuits (e.g., processor(s)). In some examples, the operations described herein are implemented by one or more configurations of one or more specifically designed logic circuits (e.g., ASIC(s)). In some examples the operations described herein are implemented by a combination of specifically designed logic circuit(s) and machine-readable instructions stored on a medium (e.g., a tangible machine-readable medium) for execution by logic circuit(s).

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. An imaging device comprising:
   a housing having an internal cavity and a window;
   an imaging assembly disposed at least partially within the housing, the imaging assembly having a field of view, wherein at least a portion of the field of view passes through the window;
   a flange portion extending at least partially around the window, the flange portion having a first surface facing the internal cavity and a second surface facing exteriorly, the second surface being diametrically opposed to the first surface, the second surface having a user-interface (UI) control region;
   a printed circuit board (PCB) having at least one capacitive touch sensor positioned thereon, the PCB being positioned adjacent the first surface of the flange portion;
   a springingly biasing tension element positioned within the cavity, the springingly biasing tension element exerting a biasing force against the PCB to bias the PCB against the first surface of the flange portion such that the at least one capacitive touch sensor is aligned with the UI control region.

2. The imaging device of claim 1, further comprising a chassis positioned at least partially within the internal cavity, wherein the springingly biasing tension element is integrally connected with the chassis.

3. The imaging device of claim 1, wherein the springingly biasing tension element includes a leaf spring that applies the biasing force at at least two points on the PCB.

4. The imaging device of claim 1, wherein the first surface includes a recessed region configured to receive the PCB.

5. The imaging device of claim 1, further comprising a decoding module configured to receive image data captured by the imaging assembly and to analyze the image data to decode at least one indicium present in the image data.

6. The imaging device of claim 5, further comprising a controller configured to, responsive to the decoding module decoding the at least one indicium, cause a payload of the at least one indicium to be transmitted to a host via a communication module.

7. The imaging device of claim 6, wherein the imaging device is configured to be positioned on or within a workstation having a flat surface, wherein the window is configured to extend in an upright direction relative to the flat surface, and wherein the flange portion extends at least along a lateral side of the window.

8. The imaging device of claim 1, wherein the springingly biasing tension element exerts the biasing force against the PCB to bias the PCB against the first surface of the flange portion such that the at least one capacitive touch sensor is in direct contact with at least some portion of the first surface of the flange portion.

9. The imaging device of claim 1, wherein the flange portion is a part of the housing.

10. An indicia reader comprising:
    a housing having a lower portion and an upper portion extending to a height greater than the lower portion, the lower portion having a generally horizontal window extending in a generally horizontal plane, the upper portion having an upright window extending in a generally upright direction relative to the generally horizontal plane;
    an imaging assembly positioned at least partially inside the housing, the imaging assembly having associated therewith at least one field of view (FOV) that extends through the generally horizontal window and at least one other FOV that extends through the upright window;
    a flange portion extending at least partially around the upright window, the flange portion having a first surface facing an internal cavity of the upper portion of the housing and a second surface facing a product scanning region of the indicia reader, the second surface being diametrically opposed to the first surface, the second surface having a user-interface (UI) control region;
    a printed circuit board (PCB) having at least one capacitive touch sensor positioned thereon, the PCB being positioned adjacent the first surface of the flange portion;
    a springingly biasing tension element positioned within the cavity, the springingly biasing tension element exerting a biasing force against the PCB to bias the PCB against the first surface of the flange portion such that the at least one capacitive touch sensor is aligned with the UI control region.

11. The indicia reader of claim 10, further comprising a chassis positioned at least partially within the internal cavity, wherein the springingly biasing tension element is integrally connected with the chassis.

12. The indicia reader of claim 11, wherein the chassis further supports at least some portion of the imaging assembly.

13. The indicia reader of claim 10, wherein the chassis includes snaps that secure the PCB against the springingly biasing tension elements.

14. The indicia reader of claim 10, wherein the chassis includes at least one location feature and the PCB includes at least one complementary location feature, the at least one location feature and the at least one complementary location feature being configured to interface together to align the PCB relative to the chassis.

15. The indicia reader of claim 10, further comprising a decoding module configured to receive image data captured by the imaging assembly and to analyze the image data to decode at least one indicium present in the image data.

16. The indicia reader of claim 15, further comprising a controller configured to, responsive to the decoding module decoding the at least one indicium, cause a payload of the at least one indicium to be transmitted to a host via a communication module.

17. The indicia reader of claim 10, wherein the flange portion extends along at least one of (i) a lateral side of the upright window or (ii) a top longitudinal side of the upright window.

18. The indicia reader of claim 10, wherein the springingly biasing tension element exerts the biasing force against the PCB to bias the PCB against the first surface of the flange portion such that the at least one capacitive touch sensor is in direct contact with at least some portion of the first surface of the flange portion.

19. The indicia reader of claim 10, further including a weigh platter positioned along the lower portion of the housing.

20. The indicia reader of claim 10, wherein the first surface of the flange portion includes at least one location feature and the PCB includes at least one complementary location feature, the at least one location feature and the at least one complementary location feature being configured to interface together to align the PCB relative to the first surface.

* * * * *